(12) United States Patent
Huey et al.

(10) Patent No.: US 11,710,228 B2
(45) Date of Patent: Jul. 25, 2023

(54) DETECTING AN EXCURSION OF A CMP COMPONENT USING TIME-BASED SEQUENCE OF IMAGES AND MACHINE LEARNING

(71) Applicant: Applied Materials, Inc., Santa Clara, CA (US)

(72) Inventors: Sidney P. Huey, Fremont, CA (US); Thomas Li, Santa Clara, CA (US); Benjamin Cherian, San Jose, CA (US)

(73) Assignee: Applied Materials, Inc., Sant Clara (KR)

( * ) Notice: Subject to any disclaimer, the term of this patent is extended or adjusted under 35 U.S.C. 154(b) by 0 days.

(21) Appl. No.: 17/678,939

(22) Filed: Feb. 23, 2022

(65) Prior Publication Data

US 2022/0284561 A1 Sep. 8, 2022

Related U.S. Application Data

(60) Provisional application No. 63/157,616, filed on Mar. 5, 2021.

(51) Int. Cl.
*G06T 7/00* (2017.01)
*G06T 7/20* (2017.01)
(Continued)

(52) U.S. Cl.
CPC ............ *G06T 7/001* (2013.01); *B24B 37/005* (2013.01); *G06T 7/20* (2013.01); *H04N 5/272* (2013.01);
(Continued)

(58) Field of Classification Search
None
See application file for complete search history.

(56) References Cited

U.S. PATENT DOCUMENTS

| 4,839,994 A | 6/1989 | Heesemann |
| 6,923,709 B2 | 8/2005 | Chen et al. |

(Continued)

FOREIGN PATENT DOCUMENTS

| EP | 0268119 | 5/1993 |
| JP | 2004-042158 | 2/2004 |

(Continued)

OTHER PUBLICATIONS

International Search Report and Written Opinion in International Appln. No. PCT/US2022/017548, dated Jun. 14, 2022, 12 pages.

*Primary Examiner* — Stefan Gadomski
(74) *Attorney, Agent, or Firm* — Fish & Richardson P.C.

(57) ABSTRACT

Monitoring operations of a polishing system includes obtaining a time-based sequence of reference images of a component of the polishing system performing operations during a test operation of the polishing system, receiving from a camera a time-based sequence of monitoring images of an equivalent component of an equivalent polishing system performing operations during polishing of a substrate, determining a difference value for the time-based sequence of monitoring images by comparing the time-based sequence of reference images to the time-based sequence of monitoring image using an image processing algorithm, determining whether the difference value exceeds a threshold, and in response to determining the difference value exceeds the threshold, indicating an excursion.

20 Claims, 5 Drawing Sheets

(51) Int. Cl.
  *H04N 7/18* (2006.01)
  *H04N 5/272* (2006.01)
  *B24B 37/005* (2012.01)
  *H01L 21/306* (2006.01)
  *H01L 21/3105* (2006.01)
  *H01L 21/66* (2006.01)

(52) U.S. Cl.
  CPC ..... *H04N 7/18* (2013.01); *G06T 2207/10016* (2013.01); *G06T 2207/20081* (2013.01); *G06T 2207/20084* (2013.01); *G06T 2207/30148* (2013.01); *G06T 2207/30232* (2013.01); *H01L 21/30625* (2013.01); *H01L 21/31053* (2013.01); *H01L 22/12* (2013.01)

(56) References Cited

U.S. PATENT DOCUMENTS

| | | | |
|---|---|---|---|
| 6,939,201 | B2 | 9/2005 | Kawashita |
| 7,751,609 | B1 | 7/2010 | Berman |
| 10,360,477 | B2 | 7/2019 | Bhaskar et al. |
| 2006/0254927 | A1 | 11/2006 | Chiou et al. |
| 2006/0270322 | A1 | 11/2006 | Yilmaz et al. |
| 2016/0082566 | A1 | 3/2016 | Doughty et al. |
| 2019/0283209 | A1 | 9/2019 | Osterheld et al. |
| 2019/0294923 | A1* | 9/2019 | Riley ............... G06V 10/774 |
| 2020/0026196 | A1* | 1/2020 | Luo ................. G06V 10/7784 |
| 2020/0327654 | A1* | 10/2020 | Zhang ................ G06N 3/08 |
| 2021/0272273 | A1* | 9/2021 | Brauer ............... G06N 3/045 |
| 2021/0343561 | A1* | 11/2021 | Doong ............. G05B 19/406 |
| 2022/0043356 | A1* | 2/2022 | Zhang ............... G03F 7/705 |
| 2022/0044391 | A1* | 2/2022 | Wallingford ........ G06F 18/214 |
| 2022/0155695 | A1* | 5/2022 | Moon ................ G06N 20/00 |
| 2022/0284344 | A1* | 9/2022 | Ma .................. G06N 3/082 |
| 2022/0284560 | A1 | 9/2022 | Huey et al. |
| 2022/0335333 | A1* | 10/2022 | Cao .................. G06N 3/047 |
| 2022/0342316 | A1* | 10/2022 | Kooiman ........... G03F 7/70616 |
| 2022/0404712 | A1* | 12/2022 | Zhang .............. G03F 7/70616 |

FOREIGN PATENT DOCUMENTS

| | | |
|---|---|---|
| JP | 2006-035353 | 2/2006 |
| KR | 10-2013-0102699 | 9/2013 |

* cited by examiner

DETECTING AN EXCURSION OF A CMP COMPONENT USING TIME-BASED SEQUENCE OF IMAGES AND MACHINE LEARNING

CROSS-REFERENCE TO RELATED APPLICATIONS

This application claims priority to U.S. Provisional Application Ser. No. 63/157,616, filed on Mar. 5, 2021, the disclosure of which is incorporated by reference.

TECHNICAL FIELD

The present disclosure generally relates to chemical mechanical polishing (CMP), and more particularly, to detecting an excursion of a CMP components using a time-based sequence of images (e.g., video images).

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface and planarizing the filler layer. For certain applications, the filler layer is planarized until the top surface of a patterned layer is exposed or a desired thickness remains over the underlying layer. In addition, planarization may be used to planarize the substrate surface, e.g., of a dielectric layer, for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. In some situations, the carrier head includes a membrane that forms multiple independently pressurizable radially concentric chambers, with the pressure in each chamber controlling the polishing rate in each corresponding region on the substrate. A polishing liquid, such as slurry with abrasive particles, is supplied to the surface of the polishing pad.

Image processing aims to process one or more image frames using different algorithms, including image compressing, image filtering, image storage, and image comparison. Image comparison can be devoted to noise reduction, image matching, image encoding, and restoration, which can be implemented by one or more computers in one or more locations using one or more image comparison algorithms. Image comparison algorithms can determine a level of similarity or difference between one or more images based on image characteristics, e.g., pixel values representing brightness, color, and transparency, or metric distances (e.g., Hausdorff distance or other suitable distances) measuring respective distances between each pair of components in an image or across different image frames, or feature kernels that represent local image patches and used for matching features between images. The image comparison algorithm is further assisted with any suitable pre-processing steps such as pixel intensity adjustment, normalization, or homomorphic filtering, to name just a few examples.

Video images can also be processed using machine learning algorithms. Neural networks are machine learning models that employ one or more layers of nonlinear units to predict an output for a received input. Some neural networks include one or more hidden layers in addition to an output layer. The output of each hidden layer is used as input to the next layer in the network, i.e., the next hidden layer or the output layer. Each layer of the network generates an output from a received input in accordance with current values of a respective set of parameters.

SUMMARY

In one aspect, monitoring operations of a polishing system includes obtaining a time-based sequence of reference images of a component of the polishing system performing operations during a test operation of the polishing system, receiving from a camera a time-based sequence of monitoring images of an equivalent component of an equivalent polishing system performing operations during polishing of a substrate, determining a difference value for the time-based sequence of monitoring images by comparing the time-based sequence of reference images to the time-based sequence of monitoring image using an image processing algorithm, determining whether the difference value exceeds a threshold, and in response to determining the difference value exceeds the threshold, indicating an excursion.

In another aspect, monitoring operation of a polishing system includes receiving from a camera a time-based sequence of monitoring images of a component of a polishing system performing operations during polishing of a substrate, inputting the time-based sequence of monitoring images analyzing into a machine learning model trained by training examples to detect excursions of the component from expected operations, and receiving from the machine learning model an indication of an excursion of the component from expected operations. The training examples comprise a time-based sequence of reference images of a reference component of a reference polishing system performing operations during a test operation.

Certain implementations can include, but are not limited to, one or more of the following possible advantages.

The described techniques can serve for efficient and accurate performance analysis of components in a polishing apparatus.

First, the described techniques can enable an analysis of operations of multiple components in a polishing apparatus when dynamically performing respective operations interactive to each other. In contrast to conventional image processing techniques that analyze static components individually, the described techniques can analyze and detect excursions of operations for one or more components in real-time, based on a time-based sequence of images (e.g., video frames). The described techniques can further enable and provide accurate analysis of component operations in-situ, other than analyzing each static component separately.

Second, sensor data acquired from in-situ monitoring systems configured to monitor polishing of the substrate need not be used. Instead, the described techniques permit an efficient overall analysis of one or more components captured in video images. Additionally or in addition, the described techniques can combine the analysis data with sensor data or provide analysis of the video images as an alternative or independent check of components in addition to existing techniques for a more accurate analysis or diagnosis process.

Besides, the described techniques can generate notifications or alerts to indicate any detected excursions of one or more components in a polishing apparatus, allowing for prompt and timely human intervening or automatic control adjustments to correct the detected excursions of one or more components. The described techniques can eventually improve product quality, lower cost, and facilitate a polishing apparatus.

Also, the described techniques can store the video images that capture operations of one or more components and allow revisiting the stored video images for troubling shooting or failure analysis later, leading to a more accurate diagnosis.

Furthermore, the described techniques are easy to set up, implement, and scale up. The described techniques can be adapted to any suitable polishing apparatus because there is no need for significant modifications to accommodate one or more image sensors. The described techniques can utilize either image processing or machine learning algorithms to analyze and detect excursions of component operations, which receive, as the solo benchmark, video images of one or more components in a reference polishing apparatus performing operations according to a set of reference instructions. The described techniques can scale up for more components as long as the captured video images could encompass these components. Therefore, the described techniques are ready to scale up with image sensors that can capture more components with satisfactory resolutions.

The details of one or more embodiments of the invention are set forth in the accompanying drawings and the description below. Other features, objects, and advantages are apparent from the description and drawings, and from the claims.

DETAILED DESCRIPTION

Figure 1:
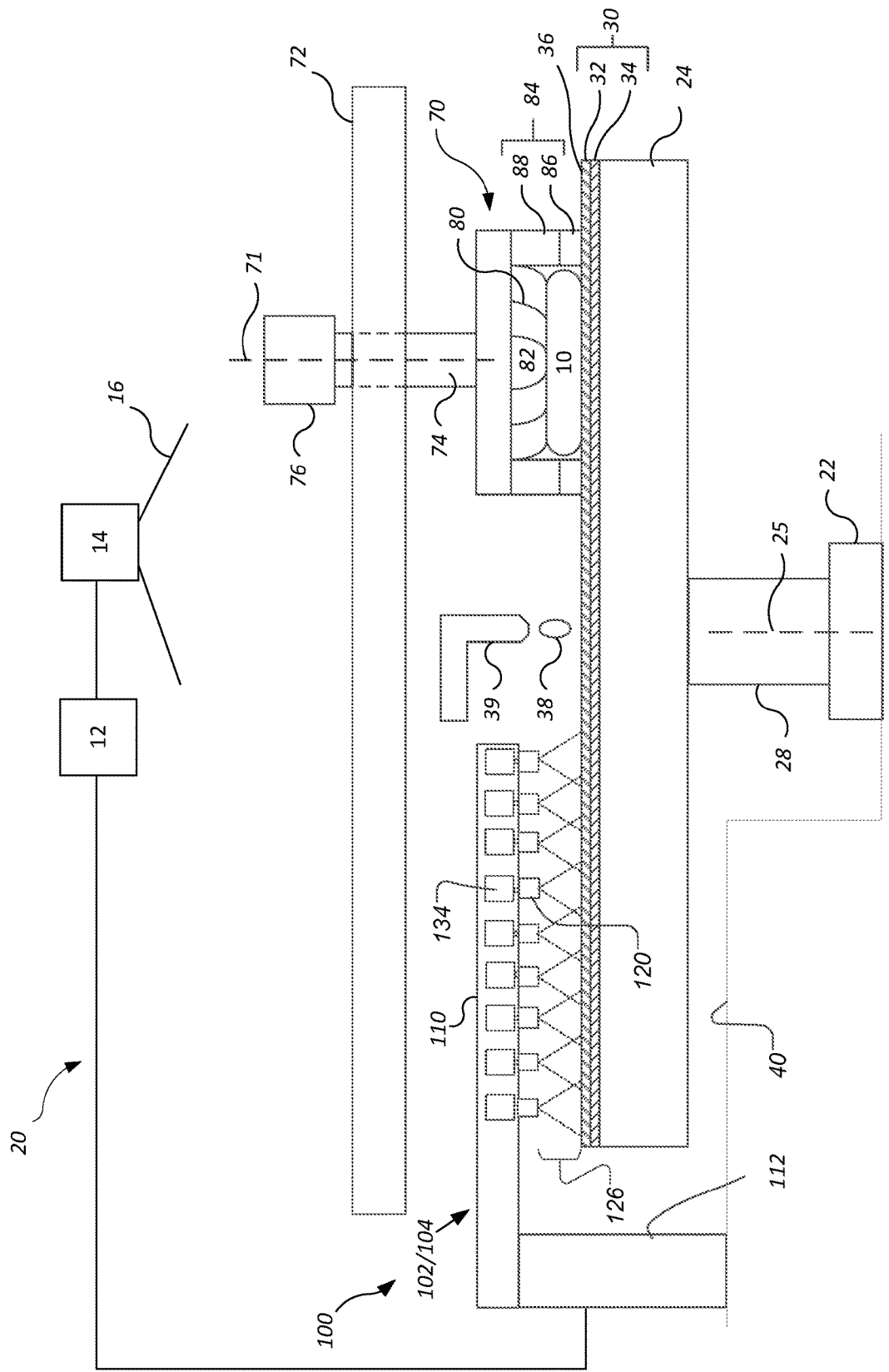
FIG. 1 is a schematic cross-sectional view of an example polishing apparatus.

In an idealized process, each component of a polishing apparatus performs operations collaboratively under a set of instructions to polish a substrate so that the substrate can have a uniform thickness after polishing. However, in practice, one or more components of a polishing apparatus can perform operations that deviate from the respective instructions. This can result in a non-uniform polishing profile for a substrate undergoing polishing, collisions of one or more components in the apparatus, and even failure of the apparatus. To avoid these consequences due to operation excursions of one or more components, it is of interest to monitor real-time component operations in a polishing apparatus, detect excursions of one or more components, and even timely adjust the one or more components to operate back on track.

Conventionally, one or more sensors can be incorporated into a polishing apparatus to monitor one or more components in the apparatus by measuring one or more characteristics of an operating component or a substrate. To name just a few examples, an optical or eddy current in-situ monitoring system can monitor a thickness of a layer on the substrate during polishing, or a thermal sensor can measure a temperature of the polishing pad during polishing. Although data from a system that monitors the substrate during polishing can provide some information, this may not be sufficient to detect or analyze deviations of the system components from their expected behavior, particularly when there are many components in the polishing apparatus.

Moreover, some conventional techniques obtain sensor data to analyze components statically—not dynamically monitor and analyze component operations while one or more components of a polishing apparatus are performing operations in-situ. These conventional techniques obtain image data of a static component and analyze the static component based on the obtained image data. The image data can include, for example, a bottom surface profile of a static retaining ring obtained through a coordinate measurement machine (CMM) for analyzing polishing edge regions of a substrate.

The techniques described below can potentially alleviate one or more of the above-noted problems. A system or a polishing apparatus adopting the described techniques can, using one or more video sensors (e.g., a camera), obtain a time-based sequence of reference images of a reference component in a reference polishing apparatus, and capture a time-based sequence of monitoring images of an equivalent component in an equivalent polishing apparatus. The time-based sequence of images is captured when one or more components are performing respective operations. The system can analyze the captured image frames between the reference component and the equivalent component to determine an excursion in real-time. In response to determine an excursion, the system can generate a notification, e.g., an alert indicating the excursion in a user interface component. The system can further instruct the polishing apparatus to adjust operations of one or more components to correct the excursions. Optionally, the system can even terminate at least a portion of operations executed in the polishing apparatus. To determine an excursion, the system can adopt different algorithms executed by one or more computers in one or more locations. The algorithms include any suitable image processing or machine learning algorithms.

In some implementations, the captured image frames can include one or more reference components. The system can analyze multiple equivalent components in a subset of the reference components captured in the captured reference image frames.

More specifically, the polishing apparatus components include a robot arm, a load cup, a conditioner arm, a transfer station, a carrier head, a slurry arm, a platen, one or more motors to drive the rotation of the carrier head and platen. The operations of these components are interactive. For example, the robot arm interacts with the load cup in a manner that the robot art is configured to grasp one substrate from a cassette and place it horizontally (i.e., the top or bottom surface of the substrate is facing along with a substantially vertical position) onto a pedestal of the load cup. As another example, the carrier head interacts with the load cup so that the carrier head is configured to grasp the substrate away from the pedestal of the load cup. The detailed structure and operations of each component in a polishing apparatus will be described below.

A polishing apparatus can control one or more of the components in the polishing apparatus to perform respective operations according to a set of instructions. The set of instructions can include a plurality of parameters predetermined by a user or automatically by the polishing apparatus to control each component's operations. The plurality of parameters can include, for example, data specified to control a position, or a motion of a component, or a change of physical field within the component. More specifically, the data can be an annular velocity for a carrier head to rotate with respect to the axis of rotation of the carrier head, or a flow rate of slurry dispensing at the nozzle of a slurry arm, to name just a few examples.

A polishing apparatus can have different sets of instructions with different parameters according to different polishing requirements. A set of instructions is also referred to as a recipe for a polishing apparatus in the description below. Once correctly executed by components of a polishing apparatus, a recipe capable of causing the polishing apparatus to polish one or more substrates substantially to fulfill a particular polishing requirement can also be referred to as a "golden recipe." Golden recipes can be different between different polishing apparatuses with different components for fulling the same polishing requirement. Ideally, a golden recipe can be adopted between equivalent polishing apparatuses under an identical polishing requirement.

The term "equivalent" described above and throughout the entire description are used to represent a level of substantial similarity. More specifically, an equivalent polishing apparatus of a reference apparatus can have substantially the same overall dimensions, structural design, number and types of components (i.e., equivalent components), and operation pipelines as the reference apparatus. As an extreme example, an equivalent polishing apparatus can be ideally the same copy of a reference apparatus (e.g., one of the product in the same production batch), or the same model, or the same model with one or more optional add-ons, or trivial modifications, or have slightly different numbers of one or more equivalent components but still maintain substantially the same operations. An equivalent component of a reference component can be described similarly as the equivalent polishing apparatus. More specifically, an equivalent component can be the same polishing component as the reference component. Alternatively, the equivalent component can be substantially identical to the reference component, with optional add-ons or trivial modifications and maintaining substantially the same operations as the reference component.

The term "excursion" described above and throughout the entire description describes departure between the measured operations of a component and the operations of the reference component. The excursion is associated only with equivalent components because the reference component is assumed to operate precisely according to a predetermined recipe. For example, the operation excursion can be quantified between captured motions of an equivalent component and the corresponding reference motions of a reference component at one or more time steps. As another example, the operation excursion can be quantified between a measured slurry flow rate from an equivalent nozzle and the corresponding reference flow rate in a reference slurry nozzle. The quantified difference can be output from different algorithms processing the captured video images, for example, video image processing or machine learning algorithms. The operation excursion can be determined, through various algorithms, by determining a difference between captured image frames of a reference component operating in a reference polishing apparatus and an equivalent component operating in an equivalent polishing apparatus and comparing the difference against a predetermined threshold value. If the determined difference exceeds the predetermined threshold value, the system or the polishing apparatus detects an excursion of the equivalent component.

FIG. 1 is a schematic cross-sectional view of an example polishing apparatus 20. The polishing apparatus 20 includes a rotatable disk-shaped platen 24 on which a polishing pad 30 is situated. The platen 24 is operable to rotate (see arrow A in FIG. 3) about an axis 25. For example, a motor 22 can turn a drive shaft 28 to rotate the platen 24. The polishing pad 30 can be a two-layer polishing pad with an outer polishing layer 34 and a softer backing layer 32. The polishing apparatus 20 can include a supply port, e.g., at the end of a slurry supply arm 39, to dispense a polishing liquid 38, such as an abrasive slurry, onto the polishing pad 30.

Figure 3:
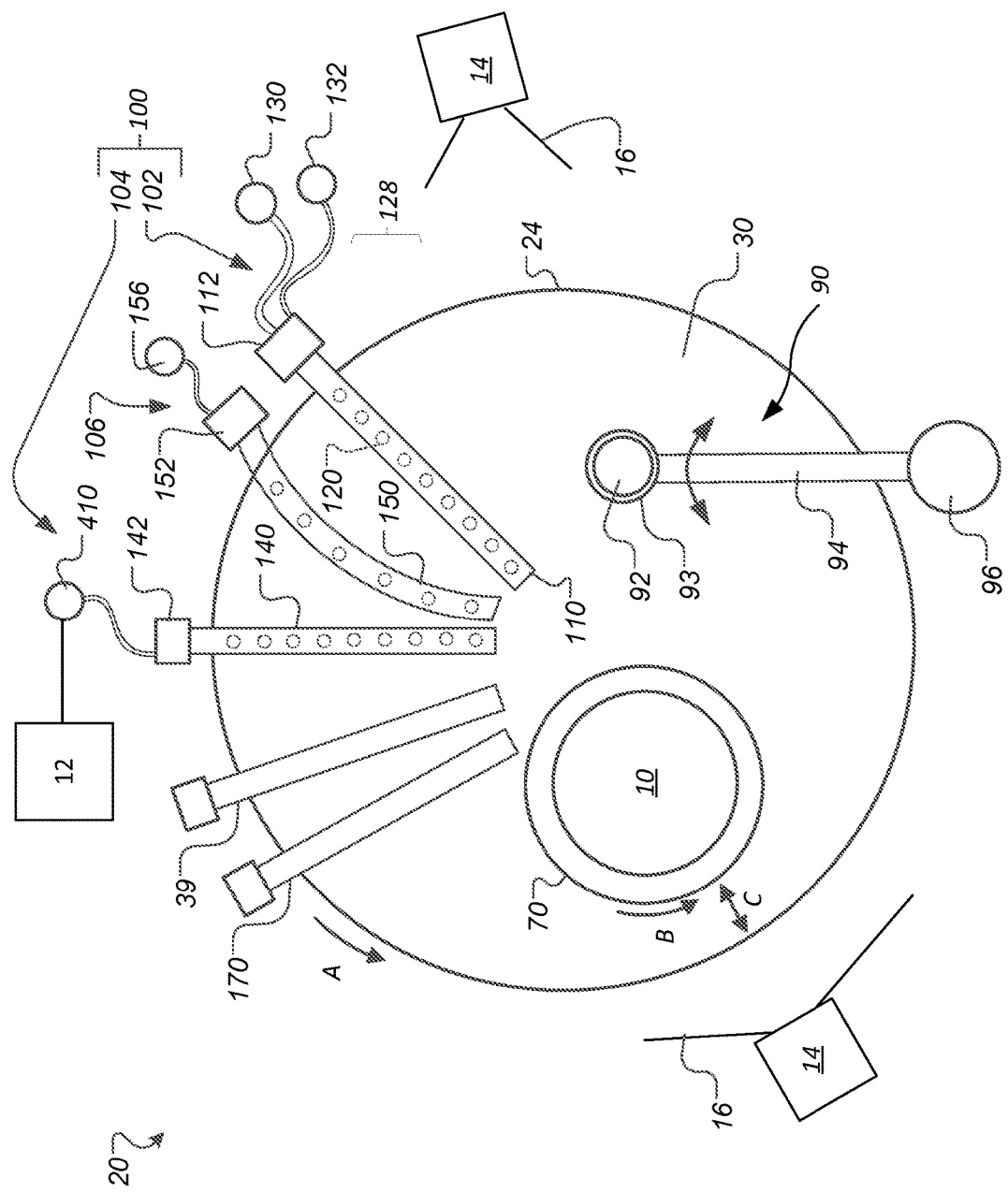
FIG. 3 is a schematic top view of an example polishing apparatus.

Referring to FIG. 3, the polishing apparatus 20 can include a pad conditioner 90 with a conditioner disk 92 to maintain the surface roughness of the polishing pad 30. The conditioner disk 92 can be positioned in a conditioner head 93 at the end of a conditioner arm 94. The arm 94 and conditioner head 93 are supported by a base 96.

The conditioner arm 94 can swing so as to sweep the conditioner head 93 and conditioner disk 92 laterally across the polishing pad 30.

Referring back to FIG. 1, the polishing apparatus 20 can also include a carrier head 70 operable to hold a substrate 10 against the polishing pad 30.

The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel, by movement along the track, or by the rotational oscillation of the carousel itself.

The carrier head 70 can include a flexible membrane 80 having a substrate mounting surface to contact the backside of the substrate 10, and a plurality of pressurizable chambers 82 to apply different pressures to different zones, e.g., different radial zones, on the substrate 10. The carrier head 70 can include a retaining ring 84 to hold the substrate. In some implementations, the retaining ring 84 may include a lower plastic portion 86 that contacts the polishing pad and an upper portion 88 of a more rigid material, e.g., a metal.

In operation, the platen 24 is rotated about its central axis 25. The carrier head is rotated about its central axis 71 (see arrow B in FIG. 3) and translated laterally (see arrow C in FIG. 3) across the top surface of the polishing pad 30.

The polishing apparatus 20 also includes a transfer station (see FIG. 2) for loading and unloading substrates from the carrier heads 70.

The transfer station can include a plurality of load cups 8, e.g., two load cups, adapted to facilitate the transfer of a substrate between the carrier heads 70 and a factory interface (not illustrated) or another device (not illustrated) by a transfer robot arm (not illustrated).

The load cups 8 generally facilitate transfer between the robot arm and each of the carrier heads 70 by loading and unloading the carrier heads 70.

Figure 2:
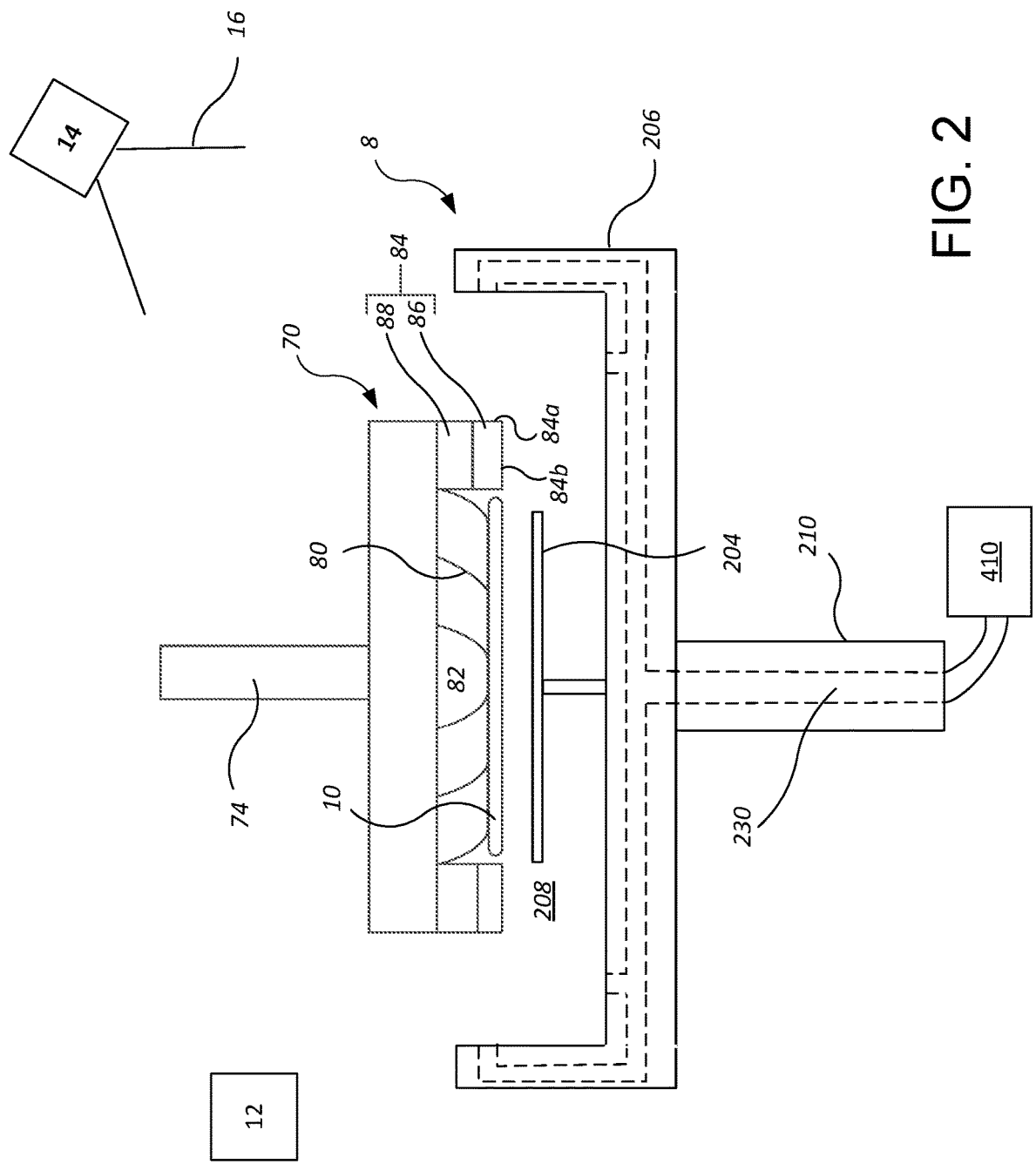
FIG. 2 is a schematic cross-sectional view of an example load cup with an example carrier head.

FIG. 2 is a schematic cross-sectional view of an example load cup 8 with an example carrier head 70. As shown in FIG. 2, each load cup 8 includes a pedestal 204 to hold the substrate 10 during a loading/unloading process. The load cup 8 also includes a housing 206 that surrounds or substantially surrounds the pedestal 204.

An actuator provides relative vertical motion between the housing 206 and the carrier head 70. For example, a shaft 210 can support the housing 206 and be vertically actuatable to raise and lower the housing 206. Alternatively or in addition, the carrier head 70 can move vertically. The pedestal 205 can be on-axis with the shaft 210. The pedestal 204 can be vertically movable relative to the housing 206.

In operation, the carrier head 70 can be positioned over the load cup 8, and the housing 206 can be raised (or the carrier head 70 lowered) so that the carrier head 70 is partially within the cavity 208. A substrate 10 can begin on the pedestal 204 and be chucked onto the carrier head 70, and/or begin on the carrier head 70 and be dechucked onto the pedestal 204.

The load cup 8 can further include nozzles to deliver steam for cleaning and/or pre-heating of the carrier head 70 and substrate 10. The polishing apparatus 20 can adjust the steam temperature, pressure, and flow rate to vary the cleaning and pre-heating of the carrier head 70 and the substrate 10. In some implementations, the temperature, pressure and/or flow rate can be independently adjustable for each nozzle or between groups of nozzles. The flow rate of nozzles in the load cup 8 can be 1-1000 cc/minute, depending on heater power and pressure.

Referring back to FIG. 1, the polishing apparatus 20 can also include a temperature control system 100 to control the temperature of the polishing pad 30 and/or slurry 38 on the polishing pad. The temperature control system 100 can include a cooling system 102 and/or a heating system 104. At least one, and in some implementations both, of the cooling system 102 and heating system 104 operate by delivering a temperature-controlled medium, e.g., a liquid, vapor or spray, onto the polishing surface 36 of the polishing pad 30 (or onto a polishing liquid that is already present on the polishing pad).

The cooling system 102 can include a source 130 of liquid coolant medium and a gas source 132 (see FIG. 3). The cooling system 102 or the heating system 104 can include an arm 110 that extends over the platen 24 and polishing pad 30 from an edge of the polishing pad to or at least near (e.g., within 5% of the total radius of the polishing pad) the center of polishing pad 30. The arm 110 can be supported by a base 112, and the base 112 can be supported on the same frame 40 as the platen 24. The base 112 can include one or more actuators, e.g., a linear actuator to raise or lower the arm 110, and/or a rotational actuator to swing the arm 110 laterally over the platen 24. The arm 110 is positioned to avoid colliding with other hardware components such as the carrier heads 70, pad conditioning disk, and the slurry dispensing arm 39.

The example cooling system 102 includes multiple nozzles 120 suspended from the arm 110. Each nozzle 120 is configured to spray a liquid coolant medium, e.g., water, onto the polishing pad 30. The arm 110 can be supported by a base 112 so that the nozzles 120 are separated from the polishing pad 30 by a gap 126.

FIG. 3 is a schematic top view of an example polishing apparatus 20. As described earlier in connection with FIG. 1, the polishing apparatus can include a heating system 102, cooling system 104, and rinse system 106. As shown in FIG. 3, the polishing apparatus can include separate arms for each of these systems. Each system can be actuated by a respective actuator. Alternatively, various subsystems can be included in a single assembly supported by a common arm and a common actuator.

Similar to the cooling system 102, the heating system 104 is connected to the heating medium tank with heating medium including a gas, e.g., steam (e.g., from the steam generator 410) or heated air, or a liquid, e.g., heated water, or a combination of gas and liquid. The heating system 104 can include a plurality of nozzles and an arm that extends over the platen 24 and polishing pad 30, supported by a base 142. The base 142 can be supported on the same frame 40 as the platen 24. The base 142 can include an actuator, e.g., a linear actuator to raise or lower the arm 140, and/or a rotational actuator to swing the arm 140 laterally over the platen 24. The arm is positioned to avoid colliding with other hardware components such as the polishing head 70, pad conditioning disk 92, and the slurry dispensing arm 39.

Similar to both cooling and heating systems, the high-pressure rinse system 106 includes a plurality of nozzles connected to a cleaning fluid tank 156 and configured to direct a cleaning fluid, e.g., water, at high intensity onto the polishing pad 30 to wash the pad 30 and remove used slurry, polishing debris, etc.

As shown in FIG. 3, an example rinse system 106 includes an arm that extends over the platen 24 and is supported by a base 152, and the base 152 can be supported on the same frame 40 as the platen 24. The base 152 can include one or more actuators, e.g., a linear actuator to raise or lower the arm 150, and/or a rotational actuator to swing the arm 150 laterally over the platen 24. The arm 150 is positioned to avoid colliding with other hardware components such as the polishing head 70, pad conditioning disk 92, and the slurry dispensing arm 39.

In some implementations, the polishing system 20 can further include a wiper blade or body 170 to distribute the polishing liquid 38 across the polishing pad 30. Along the direction of rotation of the platen 24, the wiper blade 170 can be between the slurry delivery arm 39 and the carrier head 70.

Referring back to FIGS. 1, 2, and 3, the polishing apparatus 20 can also include the controller 12 to control the operation of various components within the system. The controller 12 is also configured to receive sensor data collected by one or more sensors measuring operations of various components and provide feedback adjustments to change component operations based on analysis of received sensor data.

To perform the operation of excursion detection of one or more components, e.g., by comparison of data against data from reference components, the system can include one or more video image sensors 14 (e.g., a camera or a recorder) each positioned to having a view 16 of one or more components of the polishing apparatus 20. Each video image sensor 14 is configured to capture a time-based sequence of monitoring images of operations of at least one component in a polishing apparatus. The video image sensors 14 can be positioned generally above the platen 24 to have a downward perspective view of the top and/or side exterior surface of the various components, e.g., the carrier head 70, slurry delivery arm 39, etc. In this position, the substrate 10 is not being monitored by the video image sensors 14.

The captured monitoring images can be transmitted to the controller 12 in the polishing apparatus, or one or more computers external to the polishing apparatus 20. The system can further analyze the captured monitoring images, based on a time-based sequence of reference images for a reference component, to detect an excursion of the at least one component. Optionally, the system can generate a notification upon detection of the excursion, and adjust operations of the at least one component controlled by the controller 12. To adjust operations, the controller can transmit a feedback signal to a control mechanism (e.g., mechanism relating to an actuator, a motor, or pressure source) for adjusting operations of the at least one component. The feedback signal can be calculated by the controller 12 using an internal feedback algorithm, or received from external computers based on the captured monitoring images. The detail of obtaining reference images and analyzing captured monitoring images using different algorithms will be described below.

Figure 4:
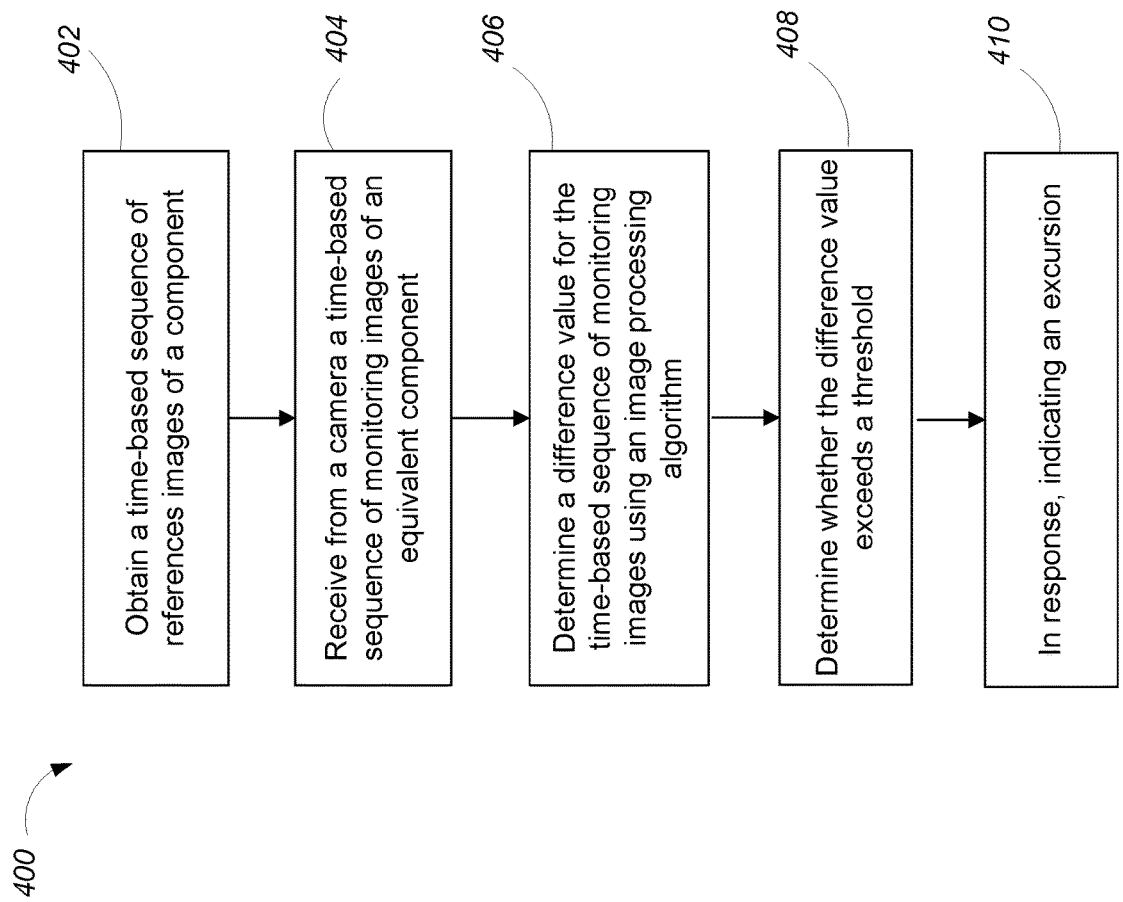
FIG. 4 is a flow diagram showing an example process of excursion detection based on video images using image processing.

FIG. 4 is a flow diagram showing an example process 400 of the excursion detection based on video images using image processing. The process 400 can be executed by one or more computers located in one or more places. Alternatively, the process 400 can be stored as instructions in the one or more computers. Once executed, the instructions can cause one or more components of the polishing apparatus to execute the process. For example, the controller 12, as shown in FIGS. 1-3, or one or more computers external to the polishing apparatus 20, can execute the process 400.

The system obtains a time-based sequence of reference images of a component of the polishing system performing operations during a test operation of the polishing system (402). The system can include one or more video cameras suitably positioned for capturing the time-based sequence of reference images.

To obtain the time-based sequence of reference images of a reference component of the polishing system, a suitable recipe is selected for the polishing system, e.g., a golden recipe, and the associated polishing system is controlled, using the controller 12 to perform operations according to the golden recipe. If the reference component operation is substantially identical to the instructed operations, the video images obtained during the test image can be used as the time-based sequence of reference images. For simplicity, the time-based sequence of reference images is also referred to as reference video in the description below.

During an actual polishing operation, e.g., as part of the fabrication process for an integrated circuit on a substrate, the system receives from a camera a time-based sequence of monitoring images of an equivalent component of an equivalent polishing system performing operations d (404). Similar to obtaining the reference video, the system can capture the time-based sequence of monitoring images using one or more cameras or receive the time-based sequence of monitoring images from a suitable external monitoring system.

The system takes the same golden recipe for the reference component in the polishing apparatus for the equivalent component in the equivalent polishing apparatus, and instructs the controller 12 of the equivalent polishing apparatus to control the equivalent component to perform operations instructed by the golden recipe. The system captures a set of time-based monitoring images using one or more cameras. The set of monitoring images should encompass at least the equivalent component in the equivalent polishing apparatus. The system can store the captured monitoring images for later analysis. For simplicity, the time-based sequence of monitoring images is also referred to as monitoring video in the description below.

The system determines a difference value for the time-based sequence of monitoring images by comparing the time-based sequence of reference images to the time-based sequence of monitoring images using an image processing algorithm (406). The system adopts an image processing algorithm to analyze the monitoring video for the equivalent component. The image processing algorithm takes as input both reference video and monitoring video, and pre-processes both videos to decrease noises, and optionally normalizes image pixel values for each frame of both videos.

The system can also set a respective start time for both videos for the image processing algorithm. Starting at the respective start time, both reference and equivalent components are in a substantially similar state and performing substantially similar operations. For example, the reference component is a carrier head in a reference polishing apparatus. The equivalent component is a copy of the carrier head in an equivalent polishing apparatus that is also a copy of the reference polishing apparatus. The system can set the respective start time for both videos so that the reference carrier head and equivalent carrier head respectively start to rotate with a respective substrate on the respective platen at the respective start time. The start time for the reference video can be different from the start time for the monitoring video. For example, the carrier head in the reference video starts to rotate on the platen at the fifth second of the reference video. However, the equivalent carrier head in the monitoring video starts to rotate on the equivalent platen at the thirty-first second of the monitoring video.

The system generates a difference value representing a similarity between each frame of the reference video and monitoring video starting from the start time. The difference value can be in any suitable form, for example, a scalar, vector, or tensor. The difference value can be calculated in any suitable manner. For example, the difference value can be a measure of difference between each pair of pixels from each frame of the monitoring and reference videos. More specifically, the measure of difference can be a root-mean-square difference by summing squared intensity difference pixel by pixel between each pair of frames, which can be the same as the output difference value. Alternatively, the difference value can be a measure of difference between each pair of group pixels or kernel outputs from each frame. The kernel receives different groups of pixels to generate features at different levels of features. For example, lower-level features can include lines or colors, and higher-level features can include basic shapes up to complex shapes representing at least a portion of an object.

In some implementations, the difference value can represent a level of similarity of a physical field obtained from both reference and monitoring videos. The system can generate, using an image processing algorithm, a velocity field, a pressure field, or a thermal field for corresponding components, and compare a difference between one or more physical fields between videos. Alternatively, the difference value can represent a difference of physical quantities in respective components between both reference and monitoring videos. For example, the system can generate average velocities, angular speed, trajectories, or vibrations of respective components in respective videos, and compare a difference between these physical quantities of components in both videos. The difference value can be a root-mean-squared difference for a respective physical quantity between videos, or a weighted sum of absolute differences for respective physical quantities between videos, to name just a few examples.

The system determines whether the difference value exceeds a threshold (408). The system can receive a pre-determined threshold from a user or automatically generate the threshold using a particular algorithm, and associate each obtained difference value with a respective threshold. The threshold can represent an upper bound for an absolute or relative difference value. For example, the threshold can be 1 mm/s for a difference value in velocity, or 10% for a difference value in a thermal field.

The system, in response to determining the difference value exceeds the threshold, indicates an excursion (410). The system can generate an alarm upon determining the difference value exceeds the threshold. The system can also generate a notification on a user interface component.

Besides, the system can also generate a user presentation on the user interface component to add information as overlays onto the captured monitoring video. More specifically, the system can present to a user the monitoring video with a plurality of overlays, each of which presents a respective characteristic of the time-based sequence of monitoring images. For example, the overlay can present, for example, various physical fields (e.g., flow field, thermal field), various physical quantities (e.g., annular speed, trajectories), and notifications (e.g., alarm, analysis summary).

The excursions can include various operations performed by equivalent components that deviate from operations performed by the reference components instructed by a reference recipe. For example, excursions can be a departure of the component from an expected path of motion (e.g., an expected trajectory). In these situations and in connection with FIGS. 1-3, the component can be, for example, a carrier head 70, a platen 24, a substrate 10 under polishing, a pedestal 204 in a load cup 8, a conditioner arm 94, arms 140, 150, 110, wiper blade 170, and a robot arm.

For example, the carrier head 70 can be detected departing from an expected rotation (e.g., rotating with a slower annular speed) by comparing the reference and monitoring videos. As another example, the wiper blade 170 can be detected departing from an expected trajectory such that the wiper collides with the carrier head 70. As another example, the pedestal 204 does not raise or lower as expected. As another example, two of the arms 94, 110, 140, and 150 collide while sweeping. As an extreme example, the substrate 10 can be detected escaping from the carrier head 70, shattering into pieces on the platen 24.

The system can further analyze the excursion of components from an expected path of motion to determine if one or more motors drive the components in the system unexpectedly. In addition, the system can determine, based on the excursion, if the initial calibration process has not been conducted properly.

Furthermore, the excursion can indicate a difference of physical fields when the component performs operations. In these situations and in connection with FIGS. 1-3, the component can be, for example, nozzles in a load cup 8, nozzles for cooling system 102, heating system 104, and rinse system 106, a platen 24, and slurry dispensing arm 39.

For example, the slurry flow rate dispensed from the dispensing arm 39 can be detected as having a slower flow rate than the reference video. As another example, the thermal field on the platen 24 can have one or more regions with high temperatures than the reference video. As another example, the nozzles in the load cup 8 can be detected as having a high water pressure that would cause an overspray. The overspray can also be detected in other components of a polishing apparatus, for example, an overspray in the slurry dispensing arm 39. As an extreme example, the platen 24 is detected overheated, and the nozzles of cooling system 102 are clogged.

After determining the difference value exceeds the threshold, the system can generate corrective operations to adjust the equivalent component performing operations to decrease the difference value. The system can generated instructions for the adjusted operations on one or more computers external to the polishing apparatus 20, or the system can instruct the controller 12 to generate the instructions. Then, the controller 12 can control corresponding components based on the instructions to adjust respective operations.

The system can scale up the analysis process readily to simultaneously detect excursions of a plurality of components in a polishing system.

The system first obtains a respective time-based sequence of references images that encompass a plurality of components of the polishing system performing operations during a respective test operation of the polishing system.

The system then receives from a camera a time-based sequence of monitoring images that encompass one or more equivalent components of an equivalent polishing system performing operations during polishing of a substrate. The plurality of components captured in the reference video should include all types of the one or more equivalent components in the equivalent polishing apparatus. The system can perform similar steps of 406, 408, and 410 for each of the one or more equivalent components.

Figure 5:
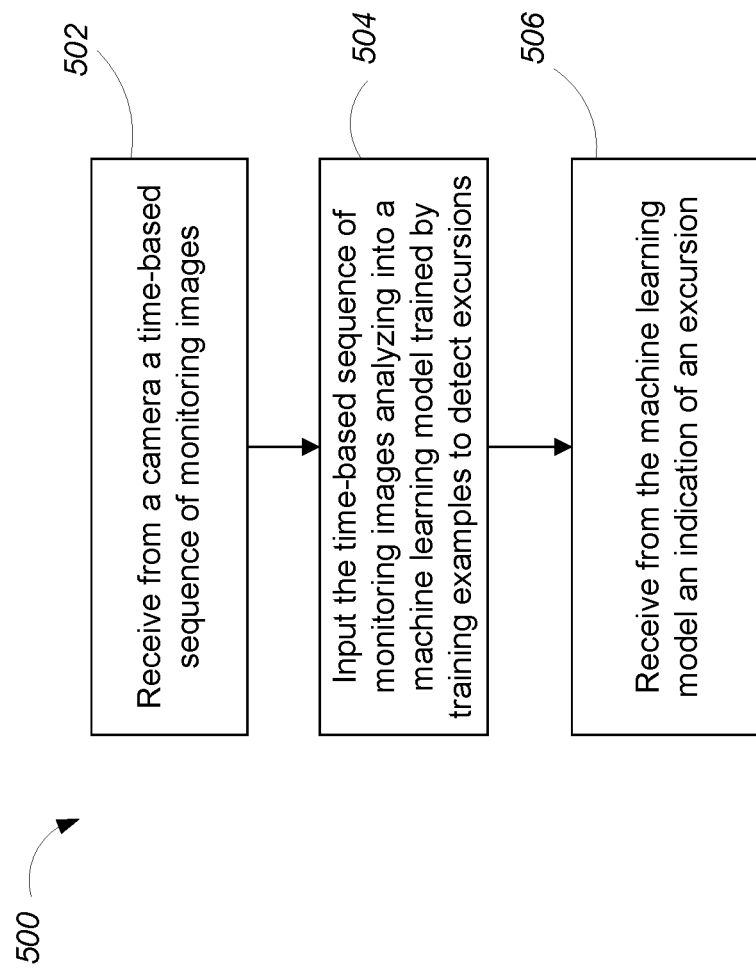
FIG. 5 is a flow diagram showing an example process of excursion detection based on video images using machine learning Like reference numbers and designations in the various drawings indicate like elements.

FIG. 5 is a flow diagram showing an example process 500 of excursion detection based on video images using machine learning. The process 500 can be executed by one or more computers located in one or more places. Alternatively, the process 500 can be stored as instructions in the one or more computers. Once executed, the instructions can cause one or more components of the polishing apparatus to execute the process. For example, the controller 12, as shown in FIGS. 1-3, or one or more computers external to the polishing apparatus 20, can execute the process 500.

The system receives from a camera a time-based sequence of monitoring images of a component of a polishing system performing operations during polishing of a test substrate (502). Similar to process 400 as described above, the system can capture the time-based sequence of monitoring images using one or more cameras or receive the time-based sequence of monitoring images from a suitable external monitoring system. The system captures the monitoring video of the component performing operations instructed by a reference recipe.

The system inputs the time-based sequence of monitoring images analyzing into a machine learning model trained by training examples to detect excursions of the component from expected operations; wherein the training examples comprise a time-based sequence of reference images of a reference component of a reference polishing system performing operations during a test operation (504) and a classification of the sequence of reference images, e.g., as normal operation or an excursion. The classification can also identify the type of excursion, e.g., failure of the pedestal in the load cup to lift, deviation of the carrier head from the expected sweep position, etc.

The system can obtain data representing a plurality of training examples from external memory or collect training examples using one or more cameras. Each training example is a time-based sequence of images of a component performing operations. To collect training examples, the system can instruct a plurality of equivalent polishing apparatuses with equivalent components to perform operations using a reference recipe (i.e., the same recipe for capturing monitoring videos) and capture respective monitoring videos for each equivalent component. The system can train the neural network based on the captured respective monitoring videos.

In some implementations, the system can obtain the training examples using both a reference component in a reference polishing apparatus and one or more equivalent components in respective equivalent polishing apparatuses. Optionally, the system can include weight values for each training example during training the neural network, and set a greater weight value for the training sample with the reference video.

After training the neural network, the system can perform inference computations using input data (e.g., monitoring videos) of equivalent components. The equivalent components are substantially similar components to those in the training samples.

The system receives from the machine learning model an indication of an excursion of the component from expected operations (506). Similar to step 410 of process 400, the system can detect an excursion of an equivalent component based on the input data (e.g., a monitoring video of the component). The excursions are similarly described in connection with process 400. The system can similarly generate corrective operations to adjust the equivalent component performing operations.

The system can store the trained neural network on one or more computers in one or more locations. One or more processors can simultaneously access the stored neural network to accelerate inference operations (e.g., parallel calculations). The system can continue training the neural network with newly captured training examples. Similarly, the system can be scaled up to monitor operations' excursion for a plurality of components in a polishing apparatus at the same time.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Control of the various systems and processes described in this specification, or portions of them, can be implemented in a computer program product that includes instructions that are stored on one or more non-transitory computer-readable storage media, and that are executable on one or more processing devices. The systems described in this specification, or portions of them, can be implemented as an apparatus, method, or electronic system that may include one or more processing devices and memory to store executable instructions to perform the operations described in this specification.

Embodiments of the classification and training of a machine learning model described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a standalone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto optical disks, or optical disks. However, a computer need not have such devices.

Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back end component, e.g., as a data server, or that includes a middleware component, e.g., an application server, or that includes a front end component, e.g., a client computer having a graphical user interface, a web browser, or an app through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments of the subject matter have been described. Other embodiments are within the scope of the following claims.

Other embodiments are within the scope of the following claims.

What is claimed is:

1. A polishing system, comprising:
    a platen to support a polishing pad;
    a carrier head to hold a substrate against the polishing pad;
    a component selected from a group of components including the platen, the carrier head, a conditioner arm, a load cup, or a robot arm;
    a camera positioned to capture a time-based sequence of monitoring images of the component; and
    a controller configured to
       receive from the camera a time-based sequence of monitoring images of the component performing operations during polishing of a substrate, and
       analyze the time-based sequence of monitoring images with a machine learning model trained by training examples to detect and indicate excursions of the component from expected operations, wherein the training examples comprise a time-based sequence of reference images of a reference component of a reference polishing system performing operations during a test operation, and
       indicate an excursion based on the analysis.

2. The system of claim 1, wherein the machine learning model is configured to, using an object tracking algorithm, determine motions of the component based on input of the time-based sequence of monitoring images.

3. The system of claim 1, wherein the machine learning model is configured to predict a physical field profile of the component based on input of the time-based sequence of monitoring images.

4. The system of claim 3, wherein the physical field profile of the component comprises: a temperature field of a rotating polishing pad, or a pressure field applied on a wafer.

5. The system of claim 3, wherein the excursion comprises departure of the component from an expected path of motion.

6. The system of claim 1, wherein the controller is configured to generate an alarm in response to an indication of an excursion.

7. The system of claim 1, further comprising a display, and wherein the controller is configured to generating a user presentation on the display, wherein the user presentation comprises the time-based sequence of monitoring images and one or more overlays each representing a respective characteristic of the time-based sequence of monitoring images.

8. A computer program product, tangibly embodied in computer-readable media, comprising instructions to cause one or more computers to:
    receive from a camera a time-based sequence of monitoring images of a component of a polishing system performing operations during polishing of a substrate; and
    analyze the time-based sequence of monitoring images with a machine learning model trained by training examples to detect and indicate excursions of the component from expected operations, wherein the training examples comprise a time-based sequence of reference images of a reference component of a reference polishing system performing operations during a test operation.

9. The computer program product of claim 8, wherein the machine learning model is configured to, using an object tracking algorithm, determine motions of the component based on input of the time-based sequence of monitoring images.

10. The computer program product of claim 8, wherein the machine learning model is configured to predict a physical field profile of the component based on input of the time-based sequence of monitoring images.

11. The computer program product of claim 10, wherein the physical field profile of the component comprises: a temperature field of a rotating polishing pad, or a pressure field applied on a wafer.

12. The computer program product of claim 8, further comprising instructions to:
    receive from a camera a time-based sequence of monitoring images encompassing a plurality of components of the polishing system performing operations during polishing of a substrate;
    input the time-based sequence of monitoring images analyzing into a machine learning model trained by training examples to detect excursions of the plurality of components from expected operations; wherein the training examples comprise a time-based sequence of reference images of a plurality of reference components of a reference polishing system performing operations during a test operation, wherein the plurality of reference components include at least components equivalent to the plurality of components; and receive from the machine learning model an indication of an excursion of the component from expected operation.

13. The computer program product of claim 8, wherein the excursion comprises departure of the component from an expected path of motion.

14. The computer program product of claim 8, wherein the excursion comprises an overspray of fluid from a fluid dispenser.

15. The computer program product of claim 8, wherein the excursion comprises a wafer slippage when undergoing polishing.

16. The computer program product of claim 8, comprising instructions to generate an alarm in response to an indication of an excursion.

17. The computer program product of claim 8, further comprising instructions to generate a user presentation on a user interface component, wherein the user presentation comprises the time-based sequence of monitoring images and one or more overlays each representing a respective characteristic of the time-based sequence of monitoring images.

18. A method for monitoring operation of a polishing system, the method comprising:

receiving from a camera a time-based sequence of monitoring images of a component of a polishing system performing operations during polishing of a substrate;

inputting the time-based sequence of monitoring images analyzing into a machine learning model trained by training examples to detect excursions of the component from expected operations, wherein the training examples comprise a time-based sequence of reference images of a reference component of a reference polishing system performing operations during a test operation and receiving from the machine learning model an indication of an excursion of the component from expected operations.

19. The method of claim 18, wherein the excursion comprises departure of the component from an expected path of motion.

20. The method of claim 19, wherein the component comprises one of a carrier head, a conditioner arm, a load cup, a platen or a robot arm.

* * * * *

UNITED STATES PATENT AND TRADEMARK OFFICE
CERTIFICATE OF CORRECTION

| | | |
|---|---|---|
| PATENT NO. | : 11,710,228 B2 | Page 1 of 1 |
| APPLICATION NO. | : 17/678939 | |
| DATED | : July 25, 2023 | |
| INVENTOR(S) | : Sidney P. Huey, Thomas Li and Benjamin Cherian | |

It is certified that error appears in the above-identified patent and that said Letters Patent is hereby corrected as shown below:

On the Title Page

Column 1, Lines 1 and 2, in the assignee section, delete "Sant Clara (KR)" and insert -- Santa Clara, CA (US) --.

Signed and Sealed this
Twenty-seventh Day of February, 2024

Katherine Kelly Vidal
Director of the United States Patent and Trademark Office